United States Patent
Pu et al.

(10) Patent No.: US 9,797,932 B2
(45) Date of Patent: Oct. 24, 2017

(54) VOLTAGE SAMPLING SYSTEM

(71) Applicant: Delta Electronics (Shanghai) Co., Ltd., Shanghai (CN)

(72) Inventors: Bo-Yu Pu, Shanghai (CN); Yi Zhang, Shanghai (CN); Ming Wang, Shanghai (CN); Hong-Jian Gan, Shanghai (CN); Jian-Ping Ying, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 329 days.

(21) Appl. No.: 14/695,029

(22) Filed: Apr. 23, 2015

(65) Prior Publication Data

US 2015/0362528 A1 Dec. 17, 2015

(30) Foreign Application Priority Data

Jun. 11, 2014 (CN) .......................... 2014 1 0258394

(51) Int. Cl.
*G01R 15/18* (2006.01)
*G01R 19/25* (2006.01)
(Continued)

(52) U.S. Cl.
CPC .......... *G01R 19/2509* (2013.01); *G01R 15/04* (2013.01); *H03M 5/12* (2013.01)

(58) Field of Classification Search
CPC ..... G01R 19/2509; G01R 15/08; G01R 15/04
See application file for complete search history.

(56) References Cited

U.S. PATENT DOCUMENTS 5,673,130 A * 9/1997 Sundstrom ............ H04L 7/0008
375/293
6,459,400 B1 10/2002 Steinbach
(Continued)

FOREIGN PATENT DOCUMENTS

CN 1882843 A 12/2006
CN 101055294 A 10/2007
(Continued)

OTHER PUBLICATIONS

Tutorial 1870, Demystifying Delta-Sigma ADCs, 2003, available at http://pdfserv.maximintegrated.com/en/an/AN1870.pdf.*
(Continued)

*Primary Examiner* — Daniel Miller
(74) *Attorney, Agent, or Firm* — CKC & Partners Co., Ltd.

(57) ABSTRACT

A voltage sampling system is provided. The voltage sampling system includes a voltage sampling device, two optic-fiber transmission lines and a control device. The voltage sampling device includes a voltage-dividing resistor module, a common mode rejection circuit and an analog-to-digital converter. The voltage-dividing resistor module generates a first and a second divided voltages according to a voltage source. The common mode rejection circuit receives the first and the second divided voltages to perform a common-mode noise rejecting process to generate an output voltage. The analog-to-digital converter converts the output voltage to generate a digital data signal. The two optic-fiber transmission lines transmit the digital data signal and a clock signal respectively. The control device receives the digital data signal from the analog-to-digital converter and the clock signal to perform a digital data processing.

22 Claims, 5 Drawing Sheets

(51) Int. Cl.
*H03M 5/12* (2006.01)
*G01R 15/04* (2006.01)

(56) References Cited

U.S. PATENT DOCUMENTS

| | | | |
|---|---|---|---|
| 7,038,421 B2 | 5/2006 | Trifilo | |
| 2004/0088629 A1* | 5/2004 | Ott | G01R 19/16542 714/742 |
| 2013/0087614 A1* | 4/2013 | Limtao | G06K 7/083 235/449 |
| 2014/0119723 A1 | 5/2014 | Chen et al. | |

FOREIGN PATENT DOCUMENTS

| | | |
|---|---|---|
| CN | 100390547 C | 5/2008 |
| CN | 101202527 A | 6/2008 |
| CN | 101231318 A | 7/2008 |
| CN | 101295983 A | 10/2008 |
| CN | 201166685 Y | 12/2008 |
| CN | 201918010 U | 8/2011 |
| CN | 202886439 U | 4/2013 |
| CN | 203232136 U | 10/2013 |
| CN | 103499800 A | 1/2014 |
| TW | 200620799 | 6/2006 |
| TW | 201229530 A | 7/2012 |

OTHER PUBLICATIONS

Leon-Garcia et al., Communication Networks—Fundamental Concepts and Key Architectures, pp. 122-125, McGraw-Hill, 2001.*
Robert Guastella, Back to the future: Manchester Encoding—Part 2, 2008, available at http://www.embedded.com/design/mcus-processors-and-socs/4007510/Back-to-the-future-Manchester-Encoding--Part-2#.*
Jingzhuo et al., Manchester encoder and decoder based on CPLD, 2008 IEEE International Conference on Industrial Technology, 2008.*

* cited by examiner

VOLTAGE SAMPLING SYSTEM

RELATED APPLICATIONS

This application claims priority to Chinese Application Serial Number 201410258394.0, filed Jun. 11, 2014, which is herein incorporated by reference.

BACKGROUND

Field of Invention

The invention relates to a voltage sampling technology, and more particularly, to a voltage sampling system.

Description of Related Art

In an electric power system, with continuous rising of voltages of power grids, the requirements to current or voltage sensors are correspondingly increased. In a conventional technology, an electromagnetic transformer is usually used for voltage sampling. However, the electromagnetic transformer has the disadvantages of complicated insulating structure, bulky volume and high manufacture cost. More seriously, ferromagnetic resonance may occur in the electromagnetic transformer and damage the device.

In recent years, although studies of electronic transformers may have overcome many disadvantages of the electromagnetic transformer, the realization of the studies is faced with some theoretical and key technical issues. Taking a hybrid electronic transformer as a representation for explanation, the theoretical and key technical issues may generally include structure design of current or voltage sensor, high-voltage side power supplying, digitalization of signal processing and interface, and protection of sensors themselves. With the realization of hybrid electronic high-voltage transformers, deep studies regarding the realization issues are more and more needed and urgent.

Thus, what is needed is a voltage sampling system to solve the aforementioned issues.

SUMMARY

Therefore, an aspect of the disclosure is to provide a voltage sampling system including a voltage sampling device, two optic-fiber transmission lines and a control device. The voltage sampling device includes a voltage-dividing resistor module, a common mode rejection circuit and an analog-to-digital converter. The voltage-dividing resistor module includes a first voltage-dividing resistor unit, a central voltage-dividing resistor unit and a second voltage-dividing resistor unit which are sequentially electrically connected in series between two terminals of a voltage source. The first voltage-dividing resistor unit and the second voltage-dividing resistor unit have substantially the same resistance values, a middle point of the central voltage-dividing resistor unit is electrically connected to a ground terminal, and the central voltage-dividing resistor unit generates a first divided voltage and a second divided voltage based on a first terminal and a second terminal of the central voltage-dividing resistor unit respectively. The common mode rejection circuit is configured to receive the first divided voltage and the second divided voltage to perform a common-mode noise rejecting process and generate an output voltage. The analog-to-digital converter is configured to convert the output voltage from analog format to digital format, so as to generate a digital data signal. The optic-fiber transmission lines are configured to transmit the digital data signal and a clock signal respectively. The control device is configured to receive the digital data signal from the analog-to-digital converter and the clock signal via the optic-fiber transmission lines, so as to perform a digital data process.

Another aspect of the disclosure is to provide a voltage sampling system including a voltage sampling device, an optic-fiber transmission line and a control device. The voltage sampling device includes a voltage-dividing resistor module, a common mode rejection circuit, an analog-to-digital converter and a transmitting module. The voltage-dividing resistor module includes a first voltage-dividing resistor unit, a central voltage-dividing resistor unit and a second voltage-dividing resistor unit which are sequentially electrically connected in series between two terminals of a voltage source. The first voltage-dividing resistor unit and the second voltage-dividing resistor unit have substantially the same resistance values, a middle point of the central voltage-dividing resistor unit is electrically connected to a ground terminal, and the central voltage-dividing resistor unit generates a first divided voltage and a second divided voltage based on a first terminal and a second terminal of the central voltage-dividing resistor unit respectively. The common mode rejection circuit is configured to receive the first divided voltage and the second divided voltage to perform a common-mode noise rejecting process and generate an output voltage. The analog-to-digital converter is configured to convert the output voltage from analog format to digital format, so as to generate a digital data signal. The transmitting module is configured to receive and encode the digital data signal and a clock signal, so as to generate an output signal. The optic-fiber transmission line is configured to transmit the output signal. The control device is configured to receive the output signal from the analog-to-digital converter via the optic-fiber transmission line, so as to perform a digital data process.

Another aspect of the disclosure is to provide a voltage sampling system including a voltage sampling device, an optic-fiber transmission line and a control device. The voltage sampling device includes a first voltage-dividing resistor module, a second voltage-dividing resistor module, a third voltage-dividing resistor module, a common mode rejection circuit, an analog-to-digital converter and a transmitting module. The first voltage-dividing resistor module includes a first voltage-dividing resistor unit and a second voltage-dividing resistor unit, and each of the first voltage-dividing resistor unit and the second voltage-dividing resistor unit has a first terminal and a second terminal. The first terminal of the first voltage-dividing resistor unit is electrically coupled to a first terminal of a first voltage source, the second terminal of the first voltage-dividing resistor unit and the first terminal of the second voltage-dividing resistor unit are connected to a first connection point in series, and the second terminal of the second voltage-dividing resistor unit is connected to a ground terminal. The second voltage-dividing resistor module includes a third voltage-dividing resistor unit and a fourth voltage-dividing resistor unit, and each of the third voltage-dividing resistor unit and the fourth voltage-dividing resistor unit has a first terminal and a second terminal. The first terminal of the third voltage-dividing resistor unit is electrically coupled to a second terminal of the first voltage source and a first terminal of a second voltage source, the second terminal of the third voltage-dividing resistor unit and the first terminal of the fourth voltage-dividing resistor unit are connected to a second connection point in series, and the second terminal of the fourth voltage-dividing resistor unit is connected to the ground terminal. The third voltage-dividing resistor module includes a fifth voltage-dividing resistor unit and a sixth voltage-dividing resistor unit, and each of the fifth voltage-dividing resistor unit and the sixth voltage-dividing resistor unit has a first terminal and a second terminal. The first terminal of the fifth voltage-dividing resistor unit is electrically coupled to a second terminal of the second voltage source, the second terminal of the fifth voltage-dividing resistor unit and the first terminal of the sixth voltage-dividing resistor unit are connected to a third connection point in series, and the second terminal of the sixth voltage-dividing resistor unit is connected to the ground terminal. The first voltage-dividing resistor unit, the third voltage-dividing resistor unit and the fifth voltage-dividing resistor unit have substantially the same resistance values, the second voltage-dividing resistor unit, the fourth voltage-dividing resistor unit and the sixth voltage-dividing resistor unit have substantially the same resistance values, and a first divided voltage, a second divided voltage and a third divided voltage are respectively generated at the first connection point, the second connection point and the third connection point based on the first voltage source and the second voltage source. The common mode rejection circuit is configured to receive the first divided voltage, the second divided voltage and the third divided voltage to perform a common-mode noise rejecting process and generate a first output voltage and a second output voltage. The analog-to-digital converter is configured to convert the first output voltage and the second output voltage from analog format to digital format, so as to generate a first digital data signal and a second digital data signal. The transmitting module is configured to receive and encode the first digital data signal, the second digital signal and a clock signal, so as to generate an output signal. The optic-fiber transmission line is configured to transmit the output signal. The control device is configured to receive the output signal from transmitting module via the optic-fiber transmission line, so as to perform a digital data process.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the embodiments of the disclosure, examples of which are illustrated in the accompanying drawings. Wherever possible, the same reference numbers are used in the drawings and the description to refer to the same or like parts.

Figure 1:
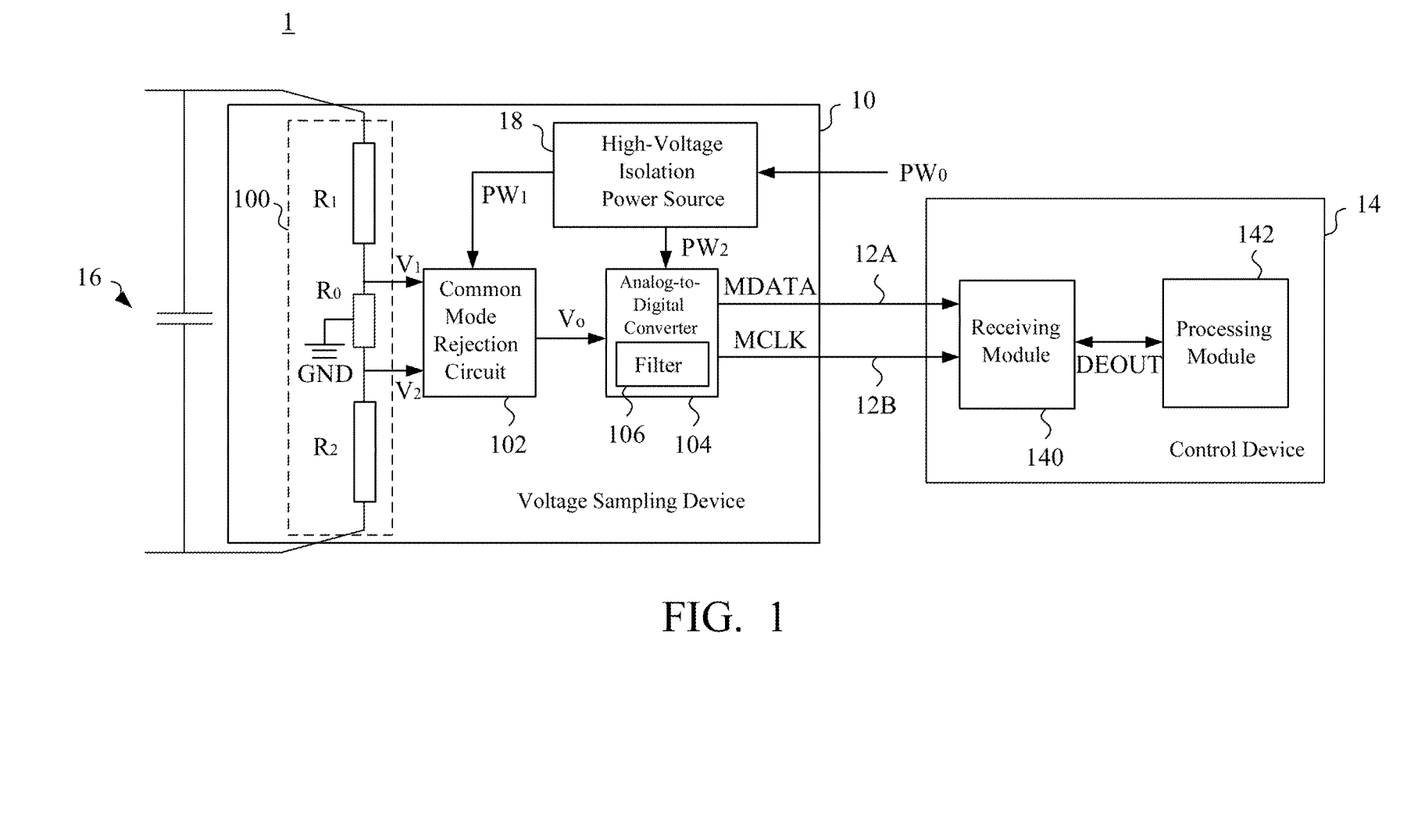
FIG. 1 is a block diagram of a voltage sampling system in accordance with an embodiment of the disclosure.

Please refer to FIG. 1, which illustrates a block diagram of a voltage sampling system 1 in accordance to an embodiment of the disclosure. The voltage sampling system 1 includes a voltage sampling device 10, two optic-fiber transmission lines 12A and 12B and a control device 14.

The voltage sampling device 10 is electrically connected to the two terminals of the voltage source 16. In an embodiment, the voltage source 16 is a high-voltage source. The voltage sampling device 10 operated at a high-voltage side performs sampling and processing on the voltage of the voltage source 16, and transmits the sampled and processed voltage to the control device 14 at a low-voltage side via the optic-fiber transmission lines 12A and 12B for digital data processing. The following descriptions explain each device in detail.

In an embodiment, each module of the voltage sampling device 10 can be formed on a sampling circuit board (not shown). The voltage sampling device 10 includes a voltage-dividing resistor module 100, a common mode rejection circuit 102 and an analog-to-digital converter 104. The voltage-dividing resistor module 100 includes a first voltage-dividing resistor unit $R_1$, a central voltage-dividing resistor unit $R_0$ and a second voltage-dividing resistor unit $R_2$ which are electrically connected in series between two terminals of the voltage source 16. It is noted that, although each of the resistor units is illustrated as one respective resistor in FIG. 1, in various embodiments, each of the first voltage-dividing resistor unit $R_1$, the central voltage-dividing resistor unit $R_0$ and the second voltage-dividing resistor unit $R_2$ can be formed by several respective resistors connected in series or in parallel, but is not limited to those illustrated in FIG. 1.

In an embodiment, the first voltage-dividing resistor unit $R_1$ and the second voltage-dividing resistor unit $R_2$ have substantially the same resistance values. It is noted that the term "substantially the same" described above relates to that the resistance values of the corresponding resistors do not need to be completely the same and may have a tolerance in a reasonable range, for example but not limited to, 5% of the resistance values. A middle point of the central voltage-dividing resistor unit $R_0$ is electrically connected to a ground terminal GND. That is, the resistance value of a first portion of the central voltage-dividing resistor unit $R_0$ and the resistance value of a second portion of the central voltage-dividing resistor unit $R_0$ are substantially the same. A terminal of the first portion of the central voltage-dividing resistor unit $R_0$ is connected to a terminal of the first voltage-dividing resistor unit $R_1$, while the other terminal of the first portion of the central voltage-dividing resistor unit $R_0$ is connected to the ground terminal GND. Likewise, a terminal of the second portion of the central voltage-dividing resistor unit $R_0$ is connected to a terminal of the second voltage-dividing resistor unit $R_2$, while the other terminal of the second portion of the central voltage-dividing resistor unit $R_0$ is connected to the ground terminal GND. Therefore, the central voltage-dividing resistor unit $R_0$ generates a first divided voltage $V_1$ and a second divided voltage $V_2$ based on a first terminal and a second terminal of the central voltage-dividing resistor unit respectively.

The common mode rejection circuit 102 receives the first divided voltage $V_1$ and the second divided voltage $V_2$. In an embodiment, the common mode rejection circuit 102 may include a common mode choke (not shown). The common mode choke is also referred to as a common mode choke coil, which is symmetric to a coil with the opposite wound direction and the same number of turns in a closed magnetic ring. In the voltage-dividing resistor module 100, noise signals with the same magnitude and direction from the first voltage-dividing resistor unit $R_1$ and the second voltage-dividing resistor unit $R_2$ will be transmitted to the common mode rejection circuit 102 along with the first divided voltage $V_1$ and the second divided voltage $V_2$. When common mode noise signal currents generated by the noise signals flow through the two coils, the directions of the common mode noise signal currents are the same, and the generated magnetic fluxes are added along the same direction, and the chock coil becomes the one with high resistance value, so as to suppress the common mode noise signals. Therefore, the common mode rejection circuit 102 can perform a common-mode noise rejecting process and generate an output voltage $V_o$.

The analog-to-digital converter 104 converts the output voltage $V_o$ from analog format to digital format, so as to generate a digital data signal MDATA with voltage amplitude information of the voltage source 16.

In an embodiment, the analog-to-digital converter 104 is a dual-channel second-order delta-sigma modulation module, which includes an integrator, a comparator and a digital-to-analog converter (not shown), used to generate the digital data signal MDATA. The characteristic of the dual-channel second-order delta-sigma modulation module is that its output signal (i.e. digital data signal MDATA) can track the input signal (i.e. the output voltage from the common mode rejection circuit 102) rapidly without attenuation.

In some embodiments, because the noise signals generated by the modulation process are shifted to a high-frequency domain, the analog-to-digital converter 104 may alternatively include a filter for filtering a high-frequency component of the noise signal of the digital data signal MDATA.

The optic-fiber transmission lines 12A and 12B transmit the digital data signal DATA and a clock signal MCLK to the control device 14 respectively.

In an embodiment, the voltage sampling system 1 further includes a high-voltage isolation power source 18 for providing power $PW_1$ and $PW_2$ to the common mode rejection circuit 102 and the analog-to-digital converter 104. In an embodiment, the high-voltage isolation power source 18 may receive a power input $PW_0$ of 24 Volts, so as to convert and generate the power $PW_1$ and $PW_2$ of 10 Volts and 5 Volts respectively. However, in another embodiment, the power received and generated by the high-voltage isolation power source 18 can be designed as various voltage values in accordance with various requirements, but is not limited to the aforementioned value.

In an embodiment, each module of the control device 14 can be formed on a sampling circuit board (not shown). The control device 14 includes a receiving module 140 and a processing module 142. The receiving module 140 receives the digital data signal MDATA and the clock signal MCLK via the optic-fiber transmission lines 12A and 12B, and performs low-pass filtering to filter out high-frequency noise signals, and generates a decoded signal DEOUT based on the digital data signal MDATA and the clock signal MCLK. In an embodiment, the receiving module 140 is a complex programmable logic device (CPLD), a field programmable gate array (FPGA) or a micro controller unit (MCU). The processing module 142 performs a digital data process on the decoded signal DEOUT. In an embodiment, the processing module 142 is a MCU or a digital signal processing (DSP) module.

In the embodiment, the digital data signal MDATA transmitted via the optic-fiber transmission lines 12A is updated with a data rate of 10 Mb/s (megabits per second). Therefore, the digital data signal MDATA and the clock signal MCLK are transmitted from the voltage sampling device 10 at the high-voltage side to the control device 14 at the low-voltage side almost without any delay.

In an embodiment, the low-pass filtering performed for enabling the receiving module 140 to transmit the decoded signal DEOUT to the processing module 142 causes a delay of 19 microseconds in correspondence with the effective number of bits (ENOB) of 12 bits. If the voltage sampling device 10 at the high-voltage side generates a signal for over-voltage protection, the transmission is still performed with the ENOB of 12 bits and the delay of 19 microseconds. In addition, when the analog-to-digital converter 104 is enabled by the delta-sigma modulation module, a certain amount of sampling values is required for completely reflecting the analog input. Therefore, transient interference can be neglected during the transmission of the digital data signal MDATA and the clock signal MCLK.

Figure 2:
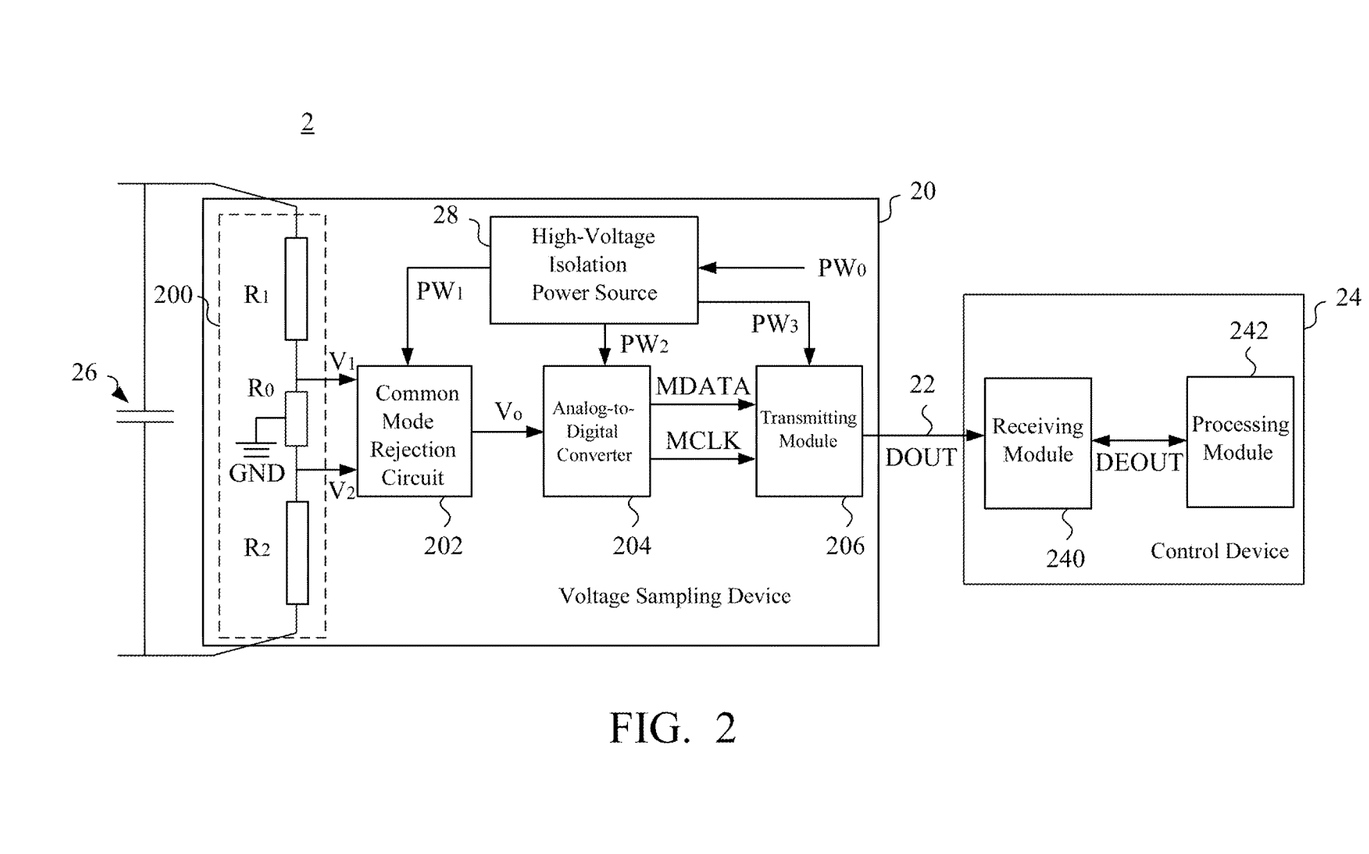
FIG. 2 is a block diagram of a voltage sampling system in accordance with another embodiment of the disclosure.

Please refer to FIG. 2. FIG. 2 is a block diagram of a voltage sampling system 2 in accordance with another embodiment of the disclosure. The voltage sampling system 2 includes a voltage sampling device 20, an optic-fiber transmission line 22 and a control device 24.

Similar to the voltage sampling system 1 of FIG. 1, in the voltage sampling system 2 illustrated in FIG. 2, the voltage sampling device 20 is electrically connected to two terminals of a voltage source 26. The voltage sampling device 20 operated at a high-voltage side performs sampling and processing on the voltage of the voltage source 26, and transmits the sampled and processed voltage to the control device 24 at a low-voltage side via the optic-fiber transmission line 22 for digital data processing. The following descriptions explain each device in detail.

The voltage sampling device 20 includes a voltage-dividing resistor module 200, a common mode rejection circuit 202, an analog-to-digital converter 204 and a transmitting module 206. The architectures and functions of the voltage-dividing resistor module 200, the common mode rejection circuit 202 and the analog-to-digital converter 204 are similar to those of the voltage-dividing resistor module 100, the common mode rejection circuit 102 and the analog-to-digital converter 104 illustrated in FIG. 1 and, thus are not described again herein.

In this embodiment, the transmitting module 206 receives a digital data signal MDATA and a clock signal MCLK and performs encoding to the digital data signal MDATA and the clock signal MCLK, so as to generate an output signal DOUT. The clock signal MCLK can be from the analog-to-digital converter 204 or from a clock module at the high-voltage side. In an embodiment, the analog-to-digital converter 204 is a delta-sigma modulation module. In an embodiment, the transmitting module 206 is a CPLD or a FPGA.

Figure 3:
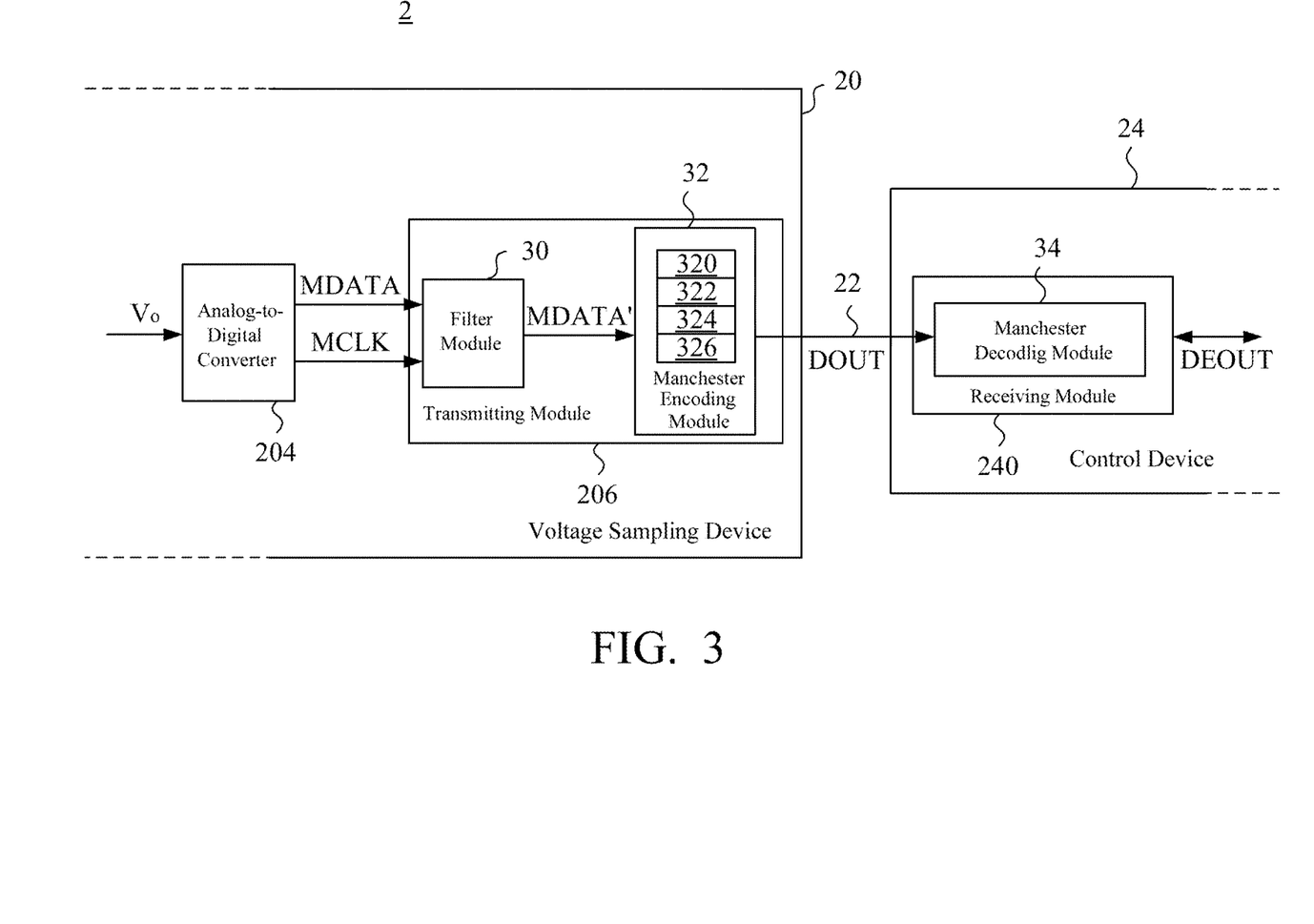
FIG. 3 is a local detailed block diagram of a voltage sampling system in accordance with an embodiment of the disclosure.

Please refer to FIG. 2 and FIG. 3 simultaneously. FIG. 3 is a local detailed block diagram of the voltage sampling system 2 in accordance with an embodiment of the disclosure.

In an embodiment, the transmitting module 206 includes a filter module 30 and a Manchester encoding module 32. In an embodiment, the filter module 30 is a cascaded integrator comb (CIC) filter, which performs low-pass filtering on the serial digital data signal MDATA with a data rate of 10 Mb/s by the analog-to-digital converter 204, and extracts parallel data MDATA' with a lower data rate of ((10 Mb/s)/64=156 Kb/s (kilobits per second)) from the digital data signal MDATA based on the clock signal MCLK.

The filter module 30 further transmits the parallel data MDATA' with 15 bits to the Manchester encoding module 32 for Manchester encoding. In an embodiment, the Manchester encoding includes a start bit block 320, a data bit block 322, a check digit block 324 and an end bit block 326.

In the Manchester encoding, the start bit block 320 is formed as a frame header, which includes continuous three zero-bits (000) starting from a falling edge. The data bit block 322 is formed by encoding the single one-bit (1) of the parallel data MDATA' to be two bits as "10" and encoding the single zero-bit (0) of the parallel data MDATA' to be two bits as "01." The check digit block 324 is formed by generating check digits through cyclic redundancy check (CRC) to the encoded data as original data and further performing the Manchester encoding process on the check digits. The end bit block 326 is formed as a frame tail, which is set to high-voltage level (i.e. 1) after the formation of the check digit block 324.

The Manchester encoding module 32 generates an output signal DOUT after performing the Manchester encoding process. Because of the Manchester encoding, the Manchester encoding module 32 may transmit the output signal DOUT to the control device 24 through only one single optic-fiber transmission line 22 with but not limited to a transmission rate of 2.5 Mb/s.

In an embodiment, the voltage sampling system 2 further includes a high-voltage isolation power source 28 for providing power to the common mode rejection circuit 202, the analog-to-digital converter 204 and the transmitting module 206. In an embodiment, the high-voltage isolation power source 28 can receive a power input $PW_0$ of 24 Volts, so as to convert and generate power $PW_1$, $PW_2$ and $PW_3$ of 10 Volts, 5 Volts and 3.3 Volts for the common mode rejection circuit 202, the analog-to-digital converter 204 and the transmitting module 206 respectively. However, in another embodiment, the power received and generated by the high-voltage isolation power source 28 can be designed as various voltage values in accordance with various requirements, but is not limited the aforementioned value.

Similar to the previous embodiment, the control device 24 includes a receiving module 240 and a processing module 242. In this embodiment, the receiving module 240 includes a Manchester decoding module 34 for receiving the output signal DOUT via the optic-fiber transmission line 22 and performing a Manchester decoding process on the output signal DOUT, so as to generate a decoded signal DEOUT. In an embodiment, the receiving module 240 is a CPLD, a FPGA or a MCU. The processing module 242 then performs a digital data process on the decoded signal DEOUT. In an embodiment, the processing module 242 is a MCU or a DSP module.

In an embodiment, because the start bit block 320, the data bit block 322, the check digit block 324 and the end bit block 326 are 3-bit, 30-bit, 16-bit and 3-bit respectively, the 52-bit data generate a delay of 20.8 microseconds (52 bits/2.5 Mb/s). By adding the delay of 19 microseconds of the low-pass filtering performed by the filter module 30, the transmission delay is 40 microseconds. The corresponding ENOB is 12 bits.

In an embodiment, when an over-voltage condition occurs from the voltage source 26, the transmitting module 206 lowers an output voltage level of the output signal DOUT, and keeps the lowered output voltage level for a predetermined period of time, for example but is not limited to 2 microseconds, for acting as a protection notification signal. After the predetermined period of time, the transmitting module 206 keeps transmitting the output signal DOUT through the Manchester decoding process for another predetermined period of time, for example but is not limited to 1 microsecond, such that the control device 24 may obtain the voltage amplitude of the voltage source 26. After that, if the over-voltage condition is still detected, the transmitting module 206 is operated to repeat the above-mentioned procedure. On the contrary, if the over-voltage condition is not detected, the transmitting module 206 is operated normally for transmitting the output signal DOUT through the Manchester decoding process.

When the receiving module 240 of the control device 24 determines that the lowered output voltage level is continuously received in a predetermined period of time, for example but is not limited to 2 microseconds, the receiving module 240 determines that the over-voltage condition occurs and performs over-voltage protection for the voltage source 26. Therefore, the transmission time of the protection notification signal is 19 microseconds of low-pass filtering of the filter module 30 in addition to 2 microseconds of the duration of the lowered output voltage level, which in total is 21 microseconds.

Therefore, in comparison with the embodiment of FIG. 1, the number of the optic-fiber transmission lines 22 is fewer in the present embodiment and, because the transmission rate of the output signal DOUT is decreased to 2.5 Mb/s, the optic-fiber transmission line with lower transmission speed and cost can be adopted. However, the transmission delay and the delay of the protection notification delay are 40 microseconds and 22 microseconds respectively, which are slightly longer than the 19 microseconds shown in the embodiment of FIG. 1.

Figure 4:
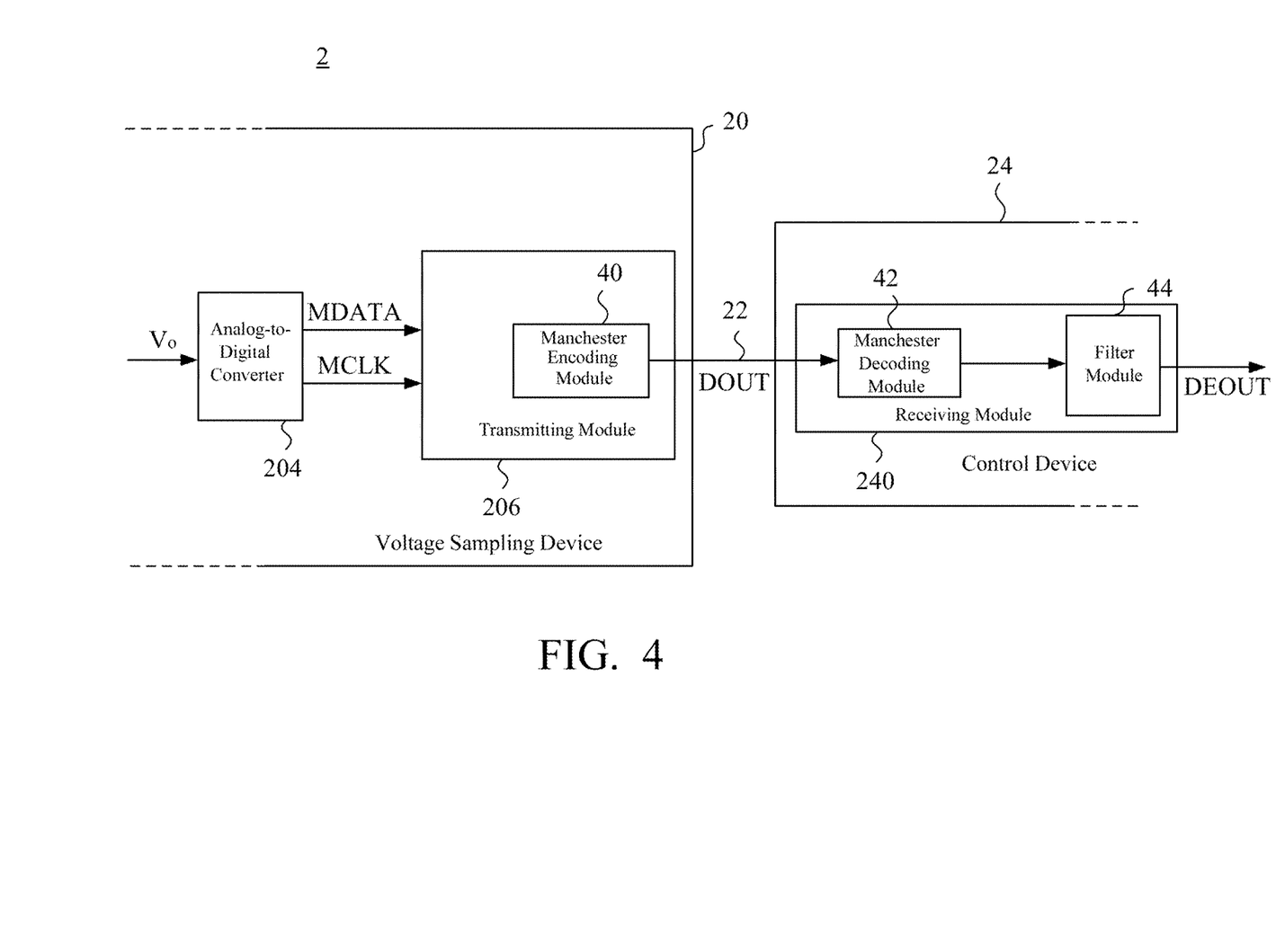
FIG. 4 is a local detailed block diagram of a voltage sampling system in accordance with another embodiment of the disclosure.

Please refer to FIG. 2 and FIG. 4 simultaneously. FIG. 4 is a local detailed block diagram of the voltage sampling system 2 in accordance with another embodiment of the disclosure.

In this embodiment, the transmitting module 206 only includes a Manchester encoding module 40 for performing a Manchester encoding process on the serial data transmitted by the analog-to-digital converter 204 with a transmission rate of 4 MB/s. In an embodiment, the Manchester encoding module 40 directly encodes the single one-bit (1) of the digital data signal MDATA to be two bits as "10" and encodes the single zero-bit (0) of the digital data signal MDATA to be two bits as "01" without adding frame header and frame tail to the data, so as to generate an output signal DOUT.

Similar to the previous embodiment, the control device 24 includes a receiving module 240 and a processing module 242. In this embodiment, the receiving module 240 includes a Manchester decoding module 42 and a filter module 44. The Manchester decoding module 42 receives the output signal DOUT via the optic-fiber transmission line 22 and performs a Manchester decoding process on the output signal DOUT, so as to generate a decoded signal DEOUT. In an embodiment, the filter module 44 is a CIC filter, which performs low-pass filtering on the decoded signal DEOUT. The processing module 242 then performs a digital data process on the decoded signal DEOUT.

Similarly, because the Manchester encoding module 40 is used for Manchester encoding, the present embodiment needs only one single optic-fiber transmission line 22. In an embodiment, when the analog-to-digital converter 204 is driven by the optic-fiber transmission line 22 with a transmission rate of 5 Mb/s and a clock frequency of 2 MHz, and the ENOB is 12 bits, a transmission delay of 96 microseconds occurs. When the ENOB is 10 bits, a transmission delay of 48 microseconds occurs. In another embodiment, when the analog-to-digital converter 204 is driven by the optic-fiber transmission line 22 with a transmission rate of 50 Mb/s and a clock frequency of 10 MHz, and the ENOB is 12 bits, a transmission delay of 19 microseconds occurs.

Figure 5:
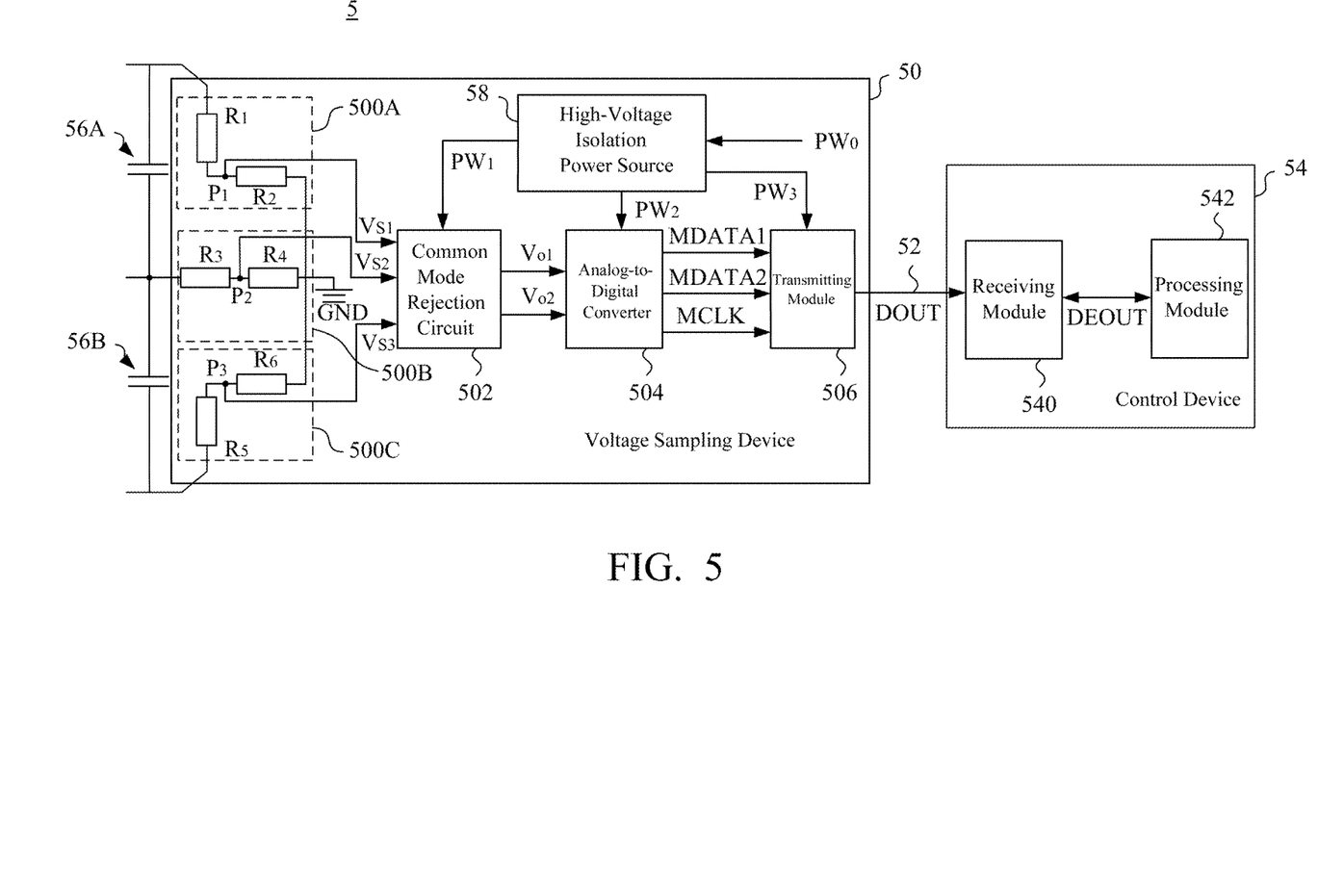
FIG. 5 is a block diagram of a voltage sampling system in accordance with another embodiment of the disclosure.

Please refer to FIG. 5. FIG. 5 is a block diagram of a voltage sampling system 5 in accordance with another embodiment of the disclosure. In this embodiment, the voltage sampling system 5 includes a voltage sampling device 50, an optic-fiber transmission line 52 and a control device 54.

In the voltage sampling system 52, the voltage sampling device 50 is electrically connected to two terminals of a first voltage source 56A and a second voltage source 56B. The voltage sampling device 50 operated at a high-voltage side performs sampling and processing on the voltages of the first voltage source 56A and the second voltage source 56B, and transmits the sampled and processed voltage to the control device 54 at a low-voltage side via the optic-fiber transmission line 52 for digital data processing. The following describes each device in detail.

The voltage sampling device 50 includes a first voltage-dividing resistor module 500A, a second voltage-dividing resistor module 500B, a third voltage-dividing resistor module 500C, a common mode rejection circuit 502, an analog-to-digital converter 504 and a transmitting module 506.

The first voltage-dividing resistor module 500A includes a first voltage-dividing resistor unit $R_1$ and a second voltage-dividing resistor unit $R_2$. A first terminal of the first voltage-dividing resistor unit $R_1$ is electrically coupled to a first terminal of the first voltage source 56A, a second terminal of the first voltage-dividing resistor unit $R_1$ and a first terminal of the second voltage-dividing resistor unit $R_2$ are connected to a first connection point $P_1$ in series, and a second terminal of the second voltage-dividing resistor unit $R_2$ is connected to a ground terminal GND.

The second voltage-dividing resistor module 500B includes a third voltage-dividing resistor unit $R_3$ and a fourth voltage-dividing resistor unit $R_4$. A first terminal of the third voltage-dividing resistor unit $R_3$ is electrically coupled to a second terminal of the first voltage source 56A and a first terminal of the second voltage source 56B, a second terminal of the third voltage-dividing resistor unit $R_3$ and a first terminal of the fourth voltage-dividing resistor unit $R_4$ are connected to a second connection point $P_2$ in series, and a second terminal of the fourth voltage-dividing resistor unit $R_4$ is connected to the ground terminal GND.

The third voltage-dividing resistor module 500C includes a fifth voltage-dividing resistor unit $R_5$ and a sixth voltage-dividing resistor unit $R_6$. A first terminal of the fifth voltage-dividing resistor unit $R_5$ is electrically coupled to a second terminal of a second voltage source 56B, a second terminal of the fifth voltage-dividing resistor unit $R_5$ and a first terminal of the sixth voltage-dividing resistor unit $R_6$ are connected to a third connection point $P_3$ in series, and a second terminal of the sixth voltage-dividing resistor unit $R_6$ is connected to the ground terminal GND.

The first voltage-dividing resistor unit $R_1$, the third voltage-dividing resistor unit $R_3$ and the fifth voltage-dividing resistor unit $R_5$ have substantially the same resistance values. The second voltage-dividing resistor unit $R_2$, the fourth voltage-dividing resistor unit $R_4$ and the sixth voltage-dividing resistor unit $R_6$ have substantially the same resistance values.

It is noted that, although each of the resistor units is illustrated as one respective resistor in FIG. 5, in various embodiments, each of the resistor units can be formed by several respective resistors connected in series or in parallel, but is not limited to those illustrated in FIG. 5.

The first voltage-dividing resistor module 500A, the second voltage-dividing resistor module 500B and the third voltage-dividing resistor module 500C generate a first divided voltage $V_{S1}$, a second divided voltage $V_{S2}$ and a third divided voltage $V_{S3}$ at the first connection point $P_1$, the second connection point $P_2$ and the third connection point $P_3$ respectively based on the first voltage source 56A and the second voltage source 56B.

The common mode rejection circuit 502 receives the first divided voltage $V_{S1}$, the second divided voltage $V_{S2}$ and the third divided voltage $V_{S3}$. Similar to the previous embodiments, the common mode rejection circuit 502 may include a common mode choke, so as to perform a common-mode noise rejecting process to the first divided voltage $V_{S1}$, the second divided voltage $V_{S2}$ and the third divided voltage $V_{S3}$ and generate an first output voltage $V_{o1}$ an second output voltage $V_{o1}$ based on the first divided voltage $V_{S1}$, the second divided voltage $V_{S2}$ and the third divided voltage $V_{S3}$.

The analog-to-digital converter 504 converts the first output voltage $V_{o1}$ and the second output voltage $V_{o2}$ from analog format to digital format, so as to generate a first digital data signal MDATA1 and a second digital data signal MDATA2 respectively with voltage amplitude information of the first voltage source 56A and the second voltage source 56B.

In various embodiments, the transmitting module 506 and the control device 54 can be realized by the architectures of FIG. 3 and FIG. 4. The transmitting module 506 transmits an output signal DOUT to the control device 54 via one single optic-fiber transmission line 52 after encoding the first digital data signal MDATA1, the second digital data signal MDATA2 and a clock signal MCLK.

In an embodiment, the voltage sampling system 5 further includes a high-voltage isolation power source 58 for providing power to the common mode rejection circuit 502, the analog-to-digital converter 504 and the transmitting module 506. In an embodiment, the high-voltage isolation power source 58 may receive a power input $PW_0$ of 24 Volts, so as to convert and generate the power $PW_1$, $PW_2$ and $PW_3$ of 10 Volts, 5 Volts and 3.3 Volts respectively, and provide the power $PW_1$, $PW_2$ and $PW_3$ to the common mode rejection circuit 502, the analog-to-digital converter 504 and the transmitting module 506 respectively. However, in another embodiment, the power received and generated by the high-voltage isolation power source 58 can be designed as various voltage values in accordance with various embodiments, but is not limited to the aforementioned values.

Therefore, the voltage sampling system 5 in this embodiment can perform sampling on the first voltage source 56A and the second voltage source 56B simultaneously. In comparison with the method of disposing two voltage sampling systems to perform sampling on the two voltage sources respectively, the voltage sampling system 5 has smaller volume and needs only one single optic-fiber for achieving transmission effects, and therefore, both cost and volume of the voltage sampling system 5 can be significantly reduced.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims.

What is claimed is:

1. A voltage sampling system, comprising:
   a voltage sampling device, comprising:
      a voltage-dividing resistor module comprising a first voltage-dividing resistor unit, a central voltage-dividing resistor unit and a second voltage-dividing resistor unit which are sequentially electrically connected in series between two terminals of a voltage source, wherein the first voltage-dividing resistor unit and the second voltage-dividing resistor unit have substantially the same resistance values, wherein a middle point of the central voltage-dividing resistor unit is electrically connected to a ground terminal, and the central voltage-dividing resistor unit generates a first divided voltage and a second divided voltage based on a first terminal and a second terminal of the central voltage-dividing resistor unit respectively;
      a common mode rejection circuit configured to receive the first divided voltage and the second divided voltage to perform a common-mode noise rejecting process and generate an output voltage;
      an analog-to-digital converter configured to convert the output voltage from analog format to digital format, thereby generating a digital data signal; and
      a transmitting module configured to receive and encode the digital data signal and a clock signal, thereby generating an output signal;
   an optic-fiber transmission line configured to transmit the output signal; and
   a control device having a processing module configured to receive the output signal from the analog-to-digital converter via the optic-fiber transmission line, thereby performing a digital data process by the processing module;
   wherein the transmitting module generates a protection notification signal when an over-voltage condition occurs from the voltage source, such that the processing module performs an over-voltage protection process for the voltage source according to the protection notification signal, and the protection notification signal is an output voltage level of the output signal lowered by the transmitting module, and the transmitting module keeps the lowered output voltage level for a predetermined period of time.

2. The voltage sampling system of claim 1, wherein the transmitting module comprises a Manchester encoding module configured to perform a Manchester encoding process on the digital data signal, thereby generating the output signal.

3. The voltage sampling system of claim 2, wherein the transmitting module further comprises a filter module configured to filter the digital data signal before performing the Manchester encoding process.

4. The voltage sampling system of claim 2, wherein the Manchester encoding module generates the output signal including a start bit block, a data bit block, a check digit block and an end bit block based on the digital data signal.

5. The voltage sampling system of claim 3, wherein the control device comprises:
   a receiving module comprising a Manchester decoding module, wherein the receiving module is configured to receive the output signal to perform a Manchester decoding process, thereby generating a decoded signal; and
   the processing module configured to perform the digital data process to the decoded signal.

6. The voltage sampling system of claim 5, wherein the receiving module is a complex programmable logic device (CPLD), a field programmable gate array (FPGA) or a first micro controller unit (MCU), and the processing module is a second micro controller unit or a digital signal processing (DSP) module.

7. The voltage sampling system of claim 2, wherein the control device comprises:
   a receiving module comprising a Manchester decoding module and a filter module, wherein the Manchester decoding module is configured to receive the output signal to perform a Manchester decoding process, thereby generating a decoded signal, and the filter module is configured to filter the decoded signal; and
   the processing module configured to perform the digital data process to the filtered decoded signal.

8. The voltage sampling system of claim 7, wherein the receiving module is a complex programmable logic device, a field programmable gate array or a first micro controller unit, and the processing module is a second micro controller unit or a digital signal processing module.

9. The voltage sampling system of claim 1, wherein the transmitting module is a complex programmable logic device or a field programmable gate array.

10. The voltage sampling system of claim 1, wherein the analog-to-digital converter is a delta-sigma modulation module.

11. The voltage sampling system of claim 1, furthering comprising a high-voltage isolation power source configured to provide power to the common mode rejection circuit, the analog-to-digital converter and the transmitting module.

12. A voltage sampling system, comprising:
   a voltage sampling device, comprising:
      a first voltage-dividing resistor module comprising a first voltage-dividing resistor unit and a second voltage-dividing resistor unit, each of the first voltage-dividing resistor unit and the second voltage-dividing resistor unit having a first terminal and a second terminal, wherein the first terminal of the first voltage-dividing resistor unit is electrically coupled to a first terminal of a first voltage source, the second terminal of the first voltage-dividing resistor unit and the first terminal of the second voltage-dividing resistor unit are connected to a first connection point in series, and the second terminal of the second voltage-dividing resistor unit is connected to a ground terminal;
      a second voltage-dividing resistor module comprising a third voltage-dividing resistor unit and a fourth voltage-dividing resistor unit, each of the third voltage-dividing resistor unit and the fourth voltage-dividing resistor unit having a first terminal and a second terminal, wherein the first terminal of the third voltage-dividing resistor unit is electrically coupled to a second terminal of the first voltage source and a first terminal of a second voltage source, the second terminal of the third voltage-dividing resistor unit and the first terminal of the fourth voltage-dividing resistor unit are connected to a second connection point in series, and the second terminal of the fourth voltage-dividing resistor unit is connected to the ground terminal;
      a third voltage-dividing resistor module comprising a fifth voltage-dividing resistor unit and a sixth voltage-dividing resistor unit, each of the fifth voltage-dividing resistor unit and the sixth voltage-dividing resistor unit having a first terminal and a second terminal, wherein the first terminal of the fifth voltage-dividing resistor unit is electrically coupled to a second terminal of the second voltage source, the second terminal of the fifth voltage-dividing resistor unit and the first terminal of the sixth voltage-dividing resistor unit are connected to a third connection point in series, and the second terminal of the sixth voltage-dividing resistor unit is connected to the ground terminal, wherein the first voltage-dividing resistor unit, the third voltage-dividing resistor unit and the fifth voltage-dividing resistor unit have substantially the same resistance values, the second voltage-dividing resistor unit, the fourth voltage-dividing resistor unit and the sixth voltage-dividing resistor unit have substantially the same resistance values, and a first divided voltage, a second divided voltage and a third divided voltage are respectively generated at the first connection point, the second connection point and the third connection point based on the first voltage source and the second voltage source;

a common mode rejection circuit configured to receive the first divided voltage, the second divided voltage and the third divided voltage to perform a common-mode noise rejecting process and generate a first output voltage and a second output voltage;

an analog-to-digital converter configured to convert the first output voltage and the second output voltage from analog format to digital format, thereby generating a first digital data signal and a second digital data signal; and a transmitting module configured to receive and encode the first digital data signal, the second digital signal and a clock signal, thereby generating an output signal;

an optic-fiber transmission line configured to transmit the output signal; and a control device configured to receive the output signal from the transmitting module via the optic-fiber transmission line, thereby performing a digital data process.

13. The voltage sampling system of claim 12, wherein the transmitting module comprises a Manchester encoding module configured to perform a Manchester encoding process on the first digital data signal and the second digital data signal, thereby generating the output signal.

14. The voltage sampling system of claim 13, wherein the transmitting module further comprises a filter module configured to filter the first digital data signal and the second digital data signal before performing the Manchester encoding process.

15. The voltage sampling system of claim 13, wherein the Manchester encoding module generates the output signal including a start bit block, a data bit block, a check digit block and an end bit block based on the first digital data signal and the second digital data signal.

16. The voltage sampling system of claim 14, wherein the control device comprises:

a receiving module configured to receive the output signal, and generate a decoded signal based on the output signal; and a processing module configured to perform the digital data process to the decoded signal.

17. The voltage sampling system of claim 16, wherein the receiving module is a complex programmable logic device (CPLD), a field programmable gate array (FPGA) or a first micro controller unit (MCU), and the processing module is a second micro controller unit or a digital signal processing (DSP) module.

18. The voltage sampling system of claim 16, wherein the transmitting module generates a protection notification signal when an over-voltage condition occurs at the first voltage source or the second voltage source, thereby enabling the processing module to perform an over-voltage protection process on the first voltage source or the second voltage source according to the protection notification signal.

19. The voltage sampling system of claim 18, wherein the protection notification signal is an output voltage level of the output signal lowered by the transmitting module, and the transmitting module keeps the lowered output voltage level for a predetermined period of time.

20. The voltage sampling system of claim 12, wherein the transmitting module is a complex programmable logic device or a field programmable gate array.

21. The voltage sampling system of claim 12, wherein the analog-to-digital converter is a delta-sigma modulation module.

22. The voltage sampling system of claim 12, furthering comprising a high-voltage isolation power source configured to provide power to the common mode rejection circuit, the analog-to-digital converter and the transmitting module.

* * * * *